United States Patent [19]
Tseng

[11] Patent Number: 5,783,490
[45] Date of Patent: Jul. 21, 1998

[54] PHOTOLITHOGRAPHY ALIGNMENT MARK AND MANUFACTURING METHOD

[75] Inventor: Horng-Huei Tseng, Hsinchu, Taiwan

[73] Assignee: Vanguard International Semiconductor Corporation, Hsin-Chu, Taiwan

[21] Appl. No.: 845,253

[22] Filed: Apr. 21, 1997

[51] Int. Cl.⁶ .................................................... H01L 21/00
[52] U.S. Cl. .................. 438/692; 216/38; 216/39; 257/752; 257/797; 438/633; 438/697; 438/724
[58] Field of Search ..................... 438/8, 9, 14, 631, 438/633, 692, 697, 724, 637, 743, 747; 216/38, 39, 18, 59, 84, 88, 67; 257/752, 758, 797

[56] References Cited

U.S. PATENT DOCUMENTS

| | | | |
|---|---|---|---|
| 4,632,724 | 12/1986 | Chesebro et al. | 438/8 |
| 5,234,868 | 8/1993 | Cote | 438/692 X |
| 5,401,691 | 3/1995 | Caldwell | 438/692 X |
| 5,482,893 | 1/1996 | Okabe et al. | 437/192 |
| 5,503,962 | 4/1996 | Caldwell | 430/317 |
| 5,622,899 | 4/1997 | Chao et al. | 438/9 |
| 5,627,110 | 5/1997 | Lee et al. | 438/692 |

*Primary Examiner*—William Powell
*Attorney, Agent, or Firm*—George O. Saile; Stephen B. Ackerman; Larry J. Prescott

[57] ABSTRACT

An alignment mark and method of forming an alignment mark are described wherein the alignment mark is formed in an alignment hole formed in a second, or inter-metal, dielectric layer and extends a step height above the second dielectric layer. The second dielectric layer is formed over a first, or inter-level, dielectric layer. The alignment mark is formed using a third, or dummy, dielectric layer formed on a planarized second dielectric layer. An alignment mark hole is formed in the second and third dielectric layers. A layer of conductor metal is formed over the third dielectric layer filling the alignment hole. That part of the conductor metal above the plane of the third dielectric layer is removed. The third dielectric layer is then removed leaving an alignment mark extending above the second dielectric layer by a step height.

21 Claims, 3 Drawing Sheets

PHOTOLITHOGRAPHY ALIGNMENT MARK AND MANUFACTURING METHOD

BACKGROUND OF THE INVENTION

(1) Field of the Invention

This invention related to an alignment mark and method of forming an alignment mark in an inter-metal dielectric layer. The alignment mark extends above the dielectric layer by a step height. The alignment mark can be formed over active integrated circuit elements as well as alignment regions.

(2) Description of the Related Art

U.S. Pat. No. 5,503,962 to Caldwell describes a method of forming an alignment mark in an alignment region of a wafer. An opening is etched in a layer of dielectric and covered with a layer of conformally deposited metal thereby reproducing the topography of the opening in the dielectric. The metal has a thickness less than the thickness of the dielectric. The metal above the plane of the dielectric is then removed forming an alignment mark having a depression below the surface of the dielectric.

U.S. Pat. No. 5,482,893 to Okabe et al. describes a method of forming alignment marks by selectively depositing metal in apertures in an insulating film.

This invention describes alignment marks formed using a dummy dielectric layer formed over an inter-metal dielectric layer. An alignment hole is formed in the dummy dielectric layer and inter-metal dielectric layer and filled with metal. The dummy dielectric layer is removed leaving an alignment mark which extends a step height above the inter-metal dielectric layer. The alignment mark can be formed in active circuit elements as well as alignment regions of the integrated circuit wafer.

SUMMARY OF THE INVENTION

The manufacture of integrated circuit wafers requires a number of sequential photolithographic steps. These sequential steps require a number of different masks to be aligned to the same frame of reference. Alignment marks formed in the integrated circuit wafer are typically used for this purpose, however some process steps may reduce their usefulness for subsequent processing steps. Alignment marks having a step height relative to the region of the wafer surrounding the alignment mark are particularly useful for automatic alignment of masks.

Planarization steps make it difficult to form alignment marks having a step height. For higher levels of metallization it is also an advantage to have alignment marks formed directly on the active integrated circuit element, or chip, without the necessity of using the alignment marks formed in alignment regions of the integrated circuit wafer.

It is a principle objective of this invention to provide a method for forming alignment marks on an active integrated circuit element or in alignment region of an integrated circuit wafer after wafer planarization wherein the alignment marks have a step height.

It is another principle objective of this invention to provide alignment marks on an active integrated circuit element or in alignment regions of an integrated circuit wafer, after wafer planarization, wherein the alignment marks have a step height.

These objectives are achieved by forming a dummy dielectric layer over a planarized layer of inter-metal dielectric. The dummy dielectric layer is thin having a thickness of between about 1000 and 1400 Angstroms. An alignment hole is then formed in the dummy dielectric layer and the layer of inter-metal dielectric using the original alignment marks for the required photolithographic masking steps. The alignment hole can be located in alignment regions of the wafer or directly over selected regions of active integrated circuit elements, such as directly over a field oxide isolation region. The alignment holes are formed at the same time via holes to be used for interconnection between two metal layers are formed.

A layer of conductor metal is then formed over the dummy dielectric layer after forming the alignment holes and the via holes thereby filling the alignment holes and via holes with conductor metal. That part of the conductor metal above the dummy dielectric layer is then removed. The dummy dielectric layer is then removed leaving conductor metal in the alignment holes to form an alignment mark. The alignment mark extends above the inter-metal dielectric layer by a step height equal to the thickness of the dummy dielectric layer.

The completed alignment mark is located directly over a selected region of an active integrated circuit element, such as a field oxide isolation region on over alignment regions of an integrated circuit wafer. The alignment mark extends above the immediately surrounding region of the inter-metal dielectric layer by a step height. This step height is useful for subsequent mask alignment steps using automatic mask alignment.

BRIEF DESCRIPTION OF THE DRAWINGS

FIG. 5 is a cross section of that part of the active integrated circuit element of FIG. 6 along line 5–5'.

DESCRIPTION OF THE PREFERRED EMBODIMENTS

Figure 1:
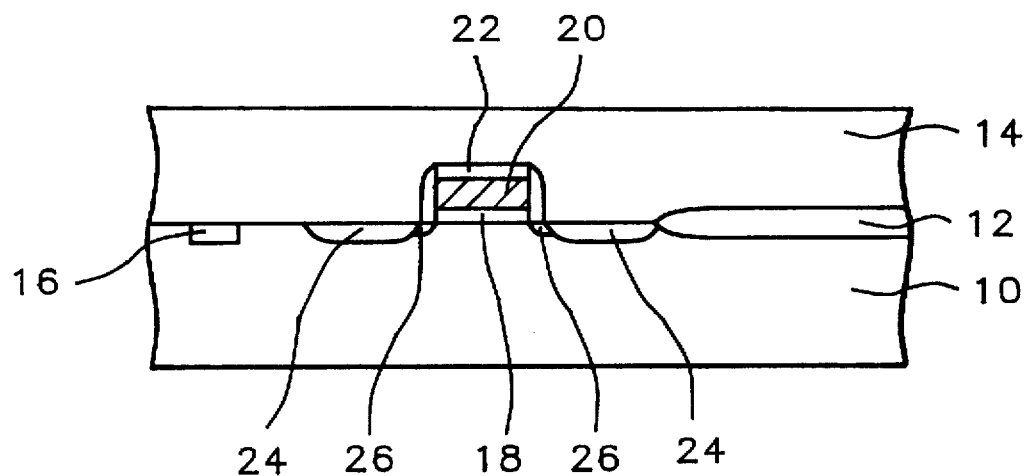
FIG. 1 shows a cross section view of a part of an active integrated circuit element showing devices formed therein, a gate electrode formed thereon, and a first dielectric layer formed thereon.

Refer now to FIGS. 1–6 for a detailed description of the preferred embodiment of a method of forming the alignment mark of this invention. FIG. 1 shows a cross section view of a part of an active integrated circuit element, or chip, of an integrated circuit wafer, such as a silicon wafer. In this example the alignment mark will be formed directly over a part of an active integrated circuit element having metal oxide semiconductor field effect transistors, MOSFETs. It will be readily apparent to those skilled in the art that the alignment mark could also be formed over active integrated circuit elements having other devices, such as bipolar devices, or an alignment region, having no devices, of the integrated circuit wafer.

FIG. 1 shows a part of an integrated circuit wafer 10, such as a silicon wafer, with a MOSFET having source/drain regions 24 and lightly doped source/drain regions 26. A gate electrode 20, formed of a conductor material such as polysilicon, is formed over a layer of gate oxide 18. A layer of cap oxide 22 is formed over the top of the gate electrode 20. A contact region 16 is formed on the integrated circuit wafer 10. A field oxide isolation region 12 is formed in the integrated circuit wafer 10 and serves to isolate devices. A first dielectric layer 14, such as borophosphosilicate glass having a thickness of between about 3000 and 8000 Angstroms, is formed over the integrated circuit wafer 10. The first dielectric layer is planarized using a method such as chemical mechanical polishing.

Figure 2:
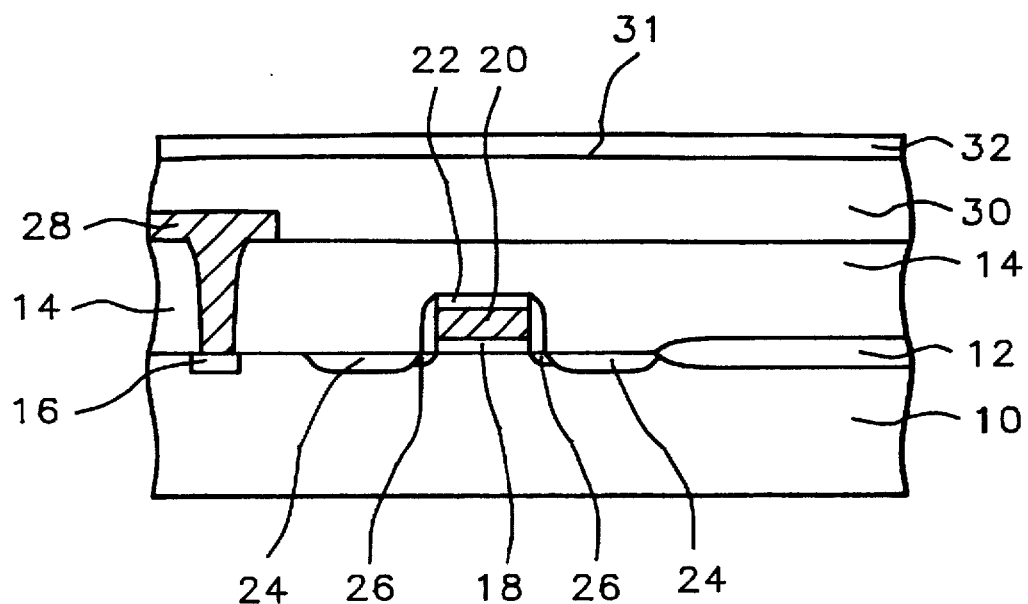
FIG. 2 shows a cross section view of a part of an active integrated circuit element showing first via holes formed in the first dielectric layer, a first conductor metal layer filling the first via holes, an inter-metal dielectric layer formed over the first dielectric layer, and a dummy dielectric layer formed over the inter-metal dielectric layer.

Next, as shown in FIG. 2, a first via holes are formed in the layer of first dielectric 14. A patterned layer of first conductor metal 28, such as titanium/titanium nitride/aluminum, is formed on the first dielectric layer 14 thereby filling the first via holes and contacting the contact regions 16 formed in the integrated circuit wafer 10. Next a second dielectric layer 30 is formed over the first dielectric layer 14. In this example the second dielectric layer 14 is a material such as silicon oxide or $SiO_x$, formed using plasma enhanced chemical vapor deposition, or spin-on-glass and has a thickness of between about 3000 and 6000 Angstroms. The second dielectric layer 30 is planarized using a method such as chemical mechanical polishing.

As shown in FIG. 2, a third dielectric layer 32, such as silicon nitride having a thickness of between about 1000 and 1400 Angstroms is formed over the second dielectric layer 30. The third dielectric layer 32 is a dummy layer used to form a step height for the alignment mark and will subsequently be removed. The third dielectric layer 32 is formed on the first surface 31 of the second dielectric layer 30.

Figure 3:
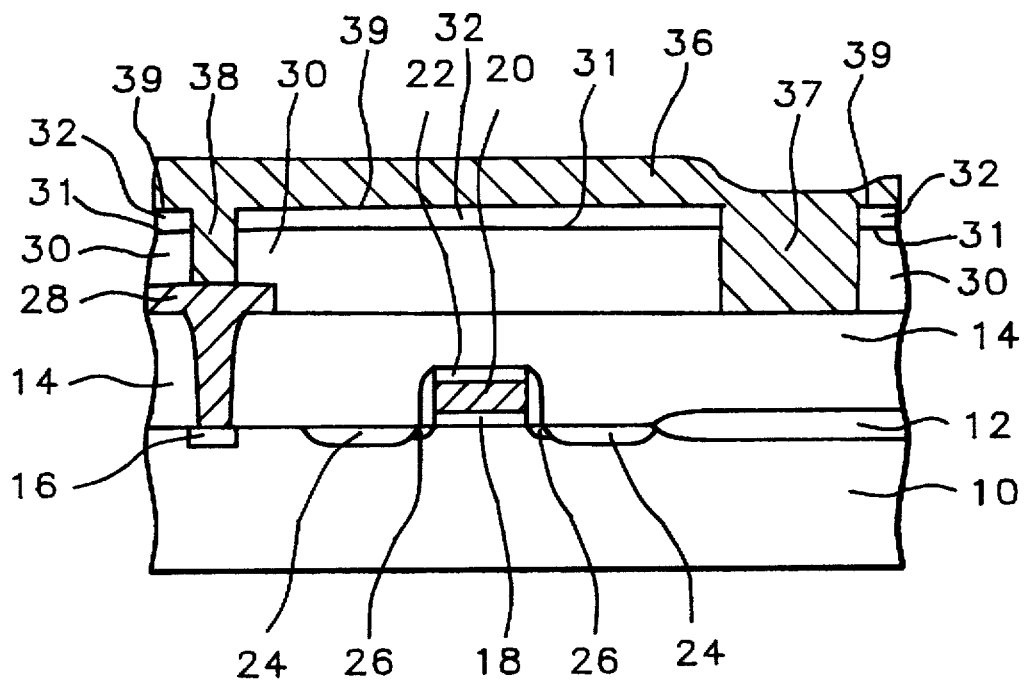
FIG. 3 shows a cross section view of a part of an active integrated circuit element showing alignment holes and second via holes formed in the inter-metal dielectric layer and the dummy dielectric layer and a layer of second conductor metal formed over the dummy dielectric layer filling the alignment holes and the second via holes.

As shown in FIG. 3 an alignment mark hole 37 and second via hole 37 are then formed in the second layer of dielectric 30 and the third layer of dielectric 32. The alignment mark hole 37 is, in this example, located directly over the field oxide isolation region 12. The bottom of the alignment mark hole 37 is, however, separated from the field oxide isolation region 12 by the first dielectric layer 14. The second via hole 38 is located over an appropriate contact region of the patterned layer of first conductor metal 28. Up until this point in the processing conventional alignment marks and alignment methods are used. Next, a layer of second conductor metal 36, such as tungsten having a thickness of between about 2000 and 10000 Angstroms is formed over the first surface 39 of the third dielectric layer 30 thereby filling the alignment mark hole 37 and the second via hole 38.

Figure 4:
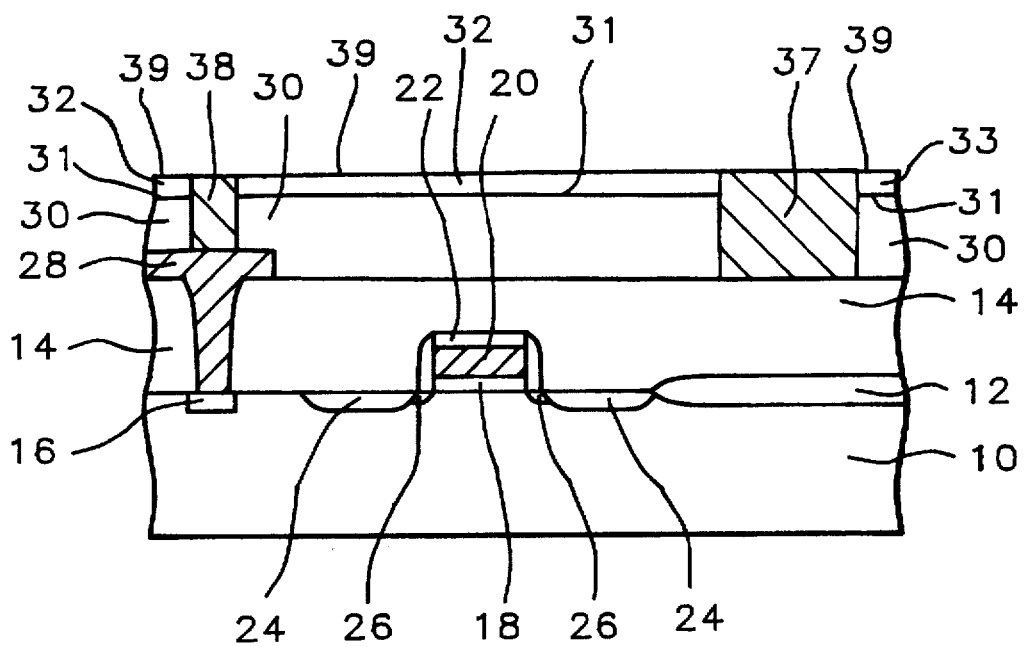
FIG. 4 shows a cross section view of a part of an active integrated circuit element after that part of the second conductor metal layer above the dummy dielectric layer has been removed.

Next, as shown in FIG. 4, the integrated circuit wafer is planarized, using a method such as chemical mechanical polishing, thereby removing that part of the layer of second conductor metal extending above the plane of the first surface 39 of the third dielectric layer. The second conductor metal fills the alignment mark hole 37 and the second via hole 38 to the plane 39 of the first surface of the third dielectric layer 32. The second conductor metal in the second via hole 38 makes electrical contact with the patterned layer of first conductor metal 28.

Figure 5:
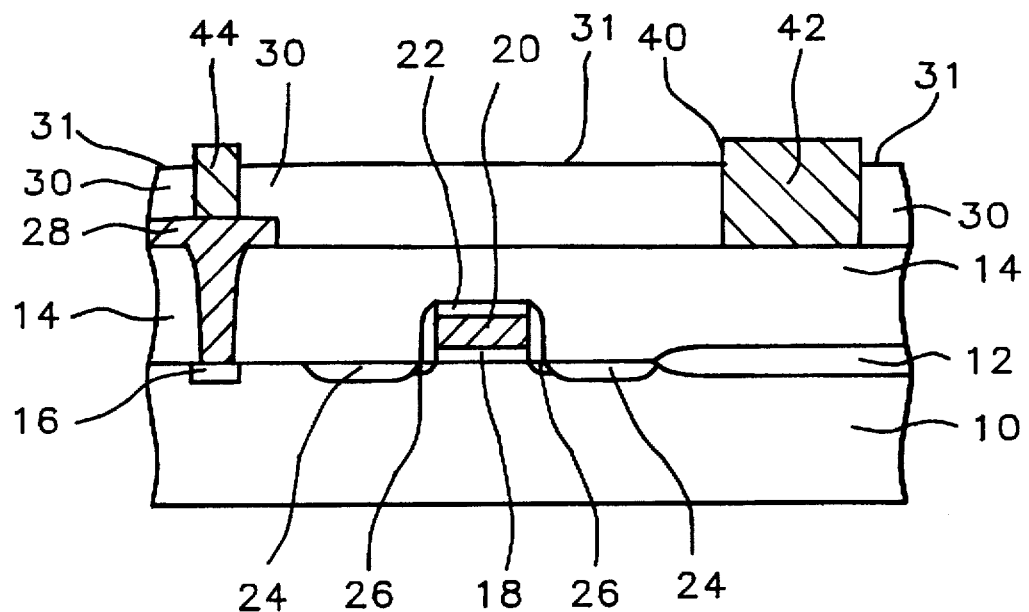
FIG. 5 shows a cross section view of a part of an active integrated circuit element after the dummy dielectric layer has been removed completing the alignment mark.
Figure 6:
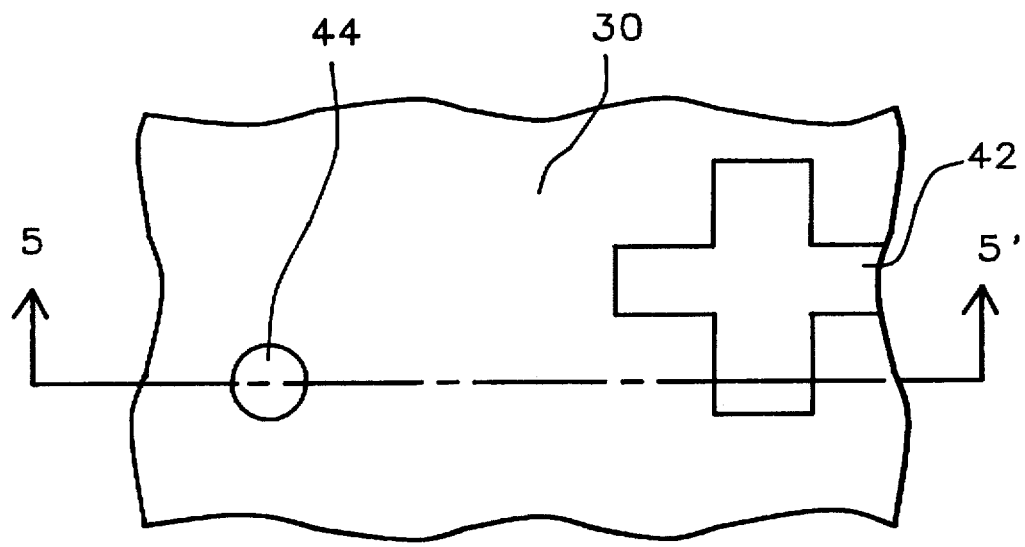
FIG. 6 shows a top view of a part of an active integrated circuit element after the dummy dielectric layer has been removed completing the alignment mark.

Next, as shown in FIG. 5, the third dielectric layer is removed using a method such as a plasma etch where the etching rate of the third dielectric is greater than the etching rate of the second dielectric. In this example a sulpher hexafluoride, $SF_6$ plasma etch is used so the etching rate of silicon nitride is greater than that of silicon oxide. After the third dielectric layer is removed a second conductor metal plug forms an alignment mark 42 and second conductor metal 44 fills the second vial hole. The alignment mark 42 extends a step height 40 above the first surface 31 of the second dielectric layer 30. The step height 40 is between about 1000 and 1400 Angstroms and can be used for automatic alignment of masks during subsequent processing steps. A top view of the part of the integrated circuit element with the alignment mark 42 and the via filled with second conductor metal is shown in FIG. 6. FIG. 5 is a cross section of FIG. 6 along line 5-5' in FIG. 6.

The completed alignment mark 42 is shown in FIGS. 5 and 6. As shown in FIG. 5 the alignment mark 42 is a second conductor metal, such as tungsten, filling an alignment hole formed in the layer of second dielectric 30. The alignment mark 42 extends above the first surface 31 of the layer of second dielectric 30 a step height 40, in this example between about 1000 and 1400 Angstroms. In this example the alignment mark 42 is formed directly over the field oxide isolation region 12 of the integrated circuit element 10 and is separated from the field oxide isolation region 12 by the first dielectric layer 14. The alignment mark could also be located in an alignment region, having no devices, of an integrated circuit wafer.

While the invention has been particularly shown and described with reference to the preferred embodiments thereof, it will be understood by those skilled in the art that various changes in form and details may be made without departing from the spirit and scope of the invention.

What is claimed is:

1. A method of forming an alignment mark, comprising the steps of:

providing an integrated circuit wafer having devices formed therein;

providing a planarized first dielectric layer having first contact holes formed over said integrated circuit wafer;

providing a patterned layer of first conductor material formed over said planarized first dielectric layer wherein said first conductor material fills said first contact holes;

forming a planarized second dielectric layer having a first surface and a second surface over said planarized first dielectric layer and said patterned layer of first conductor material wherein said second surface of said planarized second dielectric is adjacent to said first dielectric layer and said patterned layer of first conductor material;

forming a third dielectric layer having a first surface and a second surface over said first surface of said planarized second dielectric layer wherein said second surface of said third dielectric layer is adjacent to said first surface of said planarized second dielectric layer;

forming alignment mark holes in said planarized second dielectric layer and said third dielectric layer;

forming a layer of second conductor material over said first surface of said third dielectric layer whereby said second conductor material fills said alignment mark holes and extends above said first surface of said third dielectric layer;

removing that part of said layer of second conductor material extending above said first surface of said third dielectric layer; and etching away said third dielectric layer after removing that part of said layer of second conductor material extending above said first surface of said third dielectric layer thereby forming alignment marks of second conductor material wherein said alignment marks extend above said first surface of said planarized second dielectric layer by a step height.

2. The method of claim 1 wherein said second dielectric layer is silicon oxide having a thickness of between about 3000 and 6000 Angstroms.

3. The method of claim 1 wherein said second dielectric layer is spin-on-glass having a thickness of between about 3000 and 6000 Angstroms.

4. The method of claim 1 wherein said third dielectric layer is silicon nitride having a thickness of between about 1000 and 1400 Angstroms.

5. The method of claim 1 wherein said step height is between about 1000 and 1400 Angstroms.

6. The method of claim 1 wherein said layer of second conductor material is tungsten having a thickness of between about 2000 and 10000 Angstroms.

7. The method of claim 1 wherein said removing that part of said layer of second conductor material extending above said first surface of said third dielectric material is accomplished using chemical mechanical polishing.

8. The method of claim 1 wherein said integrated circuit wafer comprises active integrated circuit elements, wherein said devices are formed, and said alignment marks formed of said second conductor material are located directly above parts of said active integrated circuit elements.

9. The method of claim 1 wherein said integrated circuit wafer has field oxide isolation regions and said alignment marks formed of said second conductor material are located directly above said field oxide isolation regions.

10. The method of claim 1 further comprising forming second contact holes in said planarized second dielectric layer and said third dielectric layer during the same step said alignment mark holes are formed in said planarized second dielectric layer and said third dielectric layer whereby said forming said layer of second conductor material over said first surface of said third dielectric layer also fills said second contact holes in said planarized second dielectric layer and said third dielectric layer.

11. The method of claim 1 wherein said etching away said third dielectric layer is accomplished using a plasma etch.

12. The method of claim 1 wherein said planarized first dielectric layer is silicon oxide.

13. An integrated circuit wafer, comprising:

an silicon wafer having devices formed therein;

a planarized first dielectric layer formed over said silicon wafer having first contact holes filled with a first conductor material;

a patterned layer of said first conductor material formed over said planarized first dielectric layer;

a planarized second dielectric layer having a first surface and a second surface formed over said planarized first dielectric layer and said patterned layer of first conductor material wherein said second surface of said planarized second dielectric is adjacent to said first dielectric layer and said patterned layer of first conductor material;

alignment mark holes formed in said planarized second dielectric layer; and second conductor material filling said alignment mark holes formed in said planarized second dielectric layer and extending a step height above said first surface of said planarized second dielectric layer thereby forming alignment marks.

14. The integrated circuit wafer of claim 13 wherein said second dielectric layer is silicon oxide having a thickness of between about 3000 and 6000 Angstroms.

15. The integrated circuit wafer of claim 13 wherein said second dielectric layer is spin-on-glass having a thickness of between about 3000 and 6000 Angstroms.

16. The integrated circuit wafer of claim 13 wherein said step height is between about 1000 and 1400 Angstroms.

17. The integrated circuit wafer of claim 13 wherein said second conductor material is tungsten.

18. The integrated circuit wafer of claim 13 wherein said silicon wafer comprises active integrated circuit elements, wherein said devices are formed, and said alignment marks formed of said second conductor material are located directly above parts of said active integrated circuit elements.

19. The integrated circuit wafer of claim 13 wherein said silicon wafer has field oxide isolation regions and said alignment marks formed of said second conductor material are located directly above said field oxide isolation regions.

20. The integrated circuit wafer of claim 13 further comprising second contact holes formed in said planarized second dielectric layer and filled with second conductor material.

21. The integrated circuit wafer of claim 13 wherein said planarized first dielectric layer is silicon oxide.

* * * * *